(12) United States Patent
L'Hostis et al.

(10) Patent No.: US 7,847,623 B2
(45) Date of Patent: Dec. 7, 2010

(54) DEVICE AND METHOD FOR POWER SWITCH MONITORING

(75) Inventors: Nicolas L'Hostis, Grenoble (FR); Philippe Flatresse, Froges (FR)

(73) Assignee: STMicroelectronics S.A., Montrouge (FR)

( * ) Notice: Subject to any disclaimer, the term of this patent is extended or adjusted under 35 U.S.C. 154(b) by 142 days.

(21) Appl. No.: 12/166,674

(22) Filed: Jul. 2, 2008

(65) Prior Publication Data
US 2009/0009231 A1 Jan. 8, 2009

(30) Foreign Application Priority Data
Jul. 2, 2007 (FR) .................. 07 04773

(51) Int. Cl.
*G05F 1/575* (2006.01)
*G05F 1/56* (2006.01)

(52) U.S. Cl. .................. 327/541; 327/546; 323/311

(58) Field of Classification Search .......... None
See application file for complete search history.

(56) References Cited

U.S. PATENT DOCUMENTS

| | | | | |
|---|---|---|---|---|
| 4,868,483 A | * | 9/1989 | Tsujimoto | ............ 323/313 |
| 5,485,117 A | * | 1/1996 | Furumochi | ............ 327/538 |
| 5,694,076 A | * | 12/1997 | Ishibashi | ............ 327/541 |
| 5,781,062 A | | 7/1998 | Mashiko et al. | |
| 6,784,648 B2 | * | 8/2004 | Mitamura et al. | ............ 323/282 |
| 6,809,576 B1 | * | 10/2004 | Yamasaki | ............ 327/540 |
| 6,985,027 B2 | * | 1/2006 | Yabe | ............ 327/541 |
| 7,119,606 B2 | * | 10/2006 | Fahim | ............ 327/541 |
| 7,501,880 B2 | * | 3/2009 | Bonaccio et al. | ............ 327/534 |
| 7,554,312 B2 | * | 6/2009 | Fulton et al. | ............ 323/315 |
| 7,560,973 B2 | * | 7/2009 | Rincon-Mora et al. | ............ 327/427 |
| 7,576,574 B2 | * | 8/2009 | Noda | ............ 327/108 |
| 2003/0025130 A1 | * | 2/2003 | Takahashi et al. | ............ 257/200 |

FOREIGN PATENT DOCUMENTS

DE 196 15 413 A1 2/1997
WO WO-2007/036020 A 4/2007

* cited by examiner

*Primary Examiner*—Lincoln Donovan
*Assistant Examiner*—Terry L Englund
(74) *Attorney, Agent, or Firm*—Gardere Wynne Sewell LLP

(57) ABSTRACT

A device monitors at least one power switch which is series-mounted with a logic core between a first and a second potential. A connection point between the switch and logic core is carried to a third potential. The switch is biased by a biasing potential. The device includes a feedback control module mounted between first and second potentials which is capable of generating a set potential representative of the third potential variation. A biasing module of the power switch is mounted between the first and second potentials, and generates a biasing potential based on the set potential. The biasing potential linearly varies with the decrease of the third potential.

19 Claims, 9 Drawing Sheets

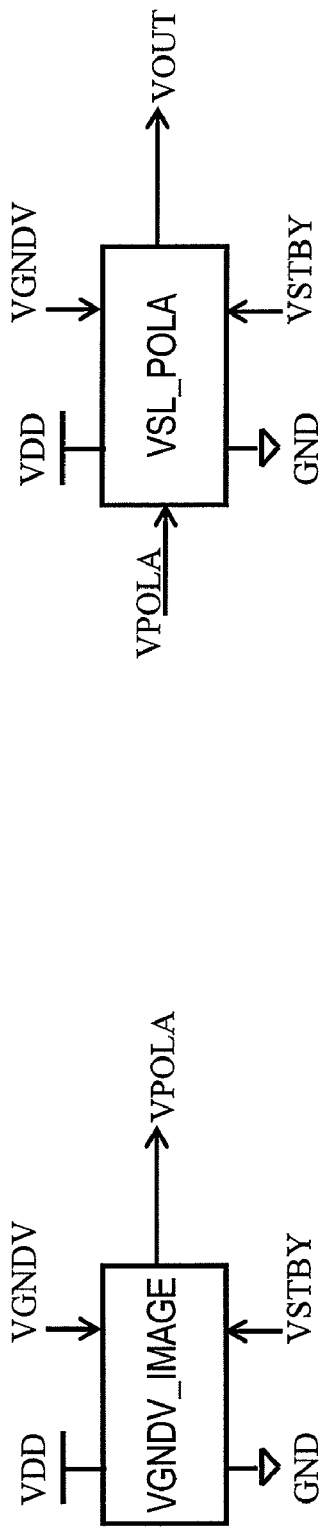
Fig. 6a
Fig. 5a
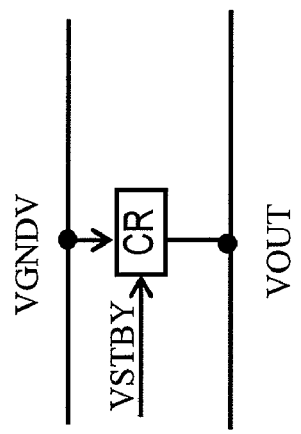
Fig. 7a

DEVICE AND METHOD FOR POWER SWITCH MONITORING

PRIORITY CLAIM

This application is a translation of and claims priority from French Application for Patent No. 07 04773 of the same title filed Jul. 2, 2007, the disclosure of which is hereby incorporated by reference.

BACKGROUND OF THE INVENTION

1. Technical Field of the Invention

The present invention relates generally to the field of power switch monitoring in sub-micronic circuits.

More particularly, the invention relates to a device and method for monitoring at least one power switch in a sub-micronic circuit, the switch being series-mounted with a logic core between a first and a second potential, the connection point between the switch and the logic core being carried to a third potential, and the switch being biased by a biasing potential.

Embodiments show particularly, but not exclusively, an interest in low consumption applications in very large scale integration systems (VLSI) and in particular during the restarting of a central processing circuit also called logic core, a logic core being for example a ring oscillator, and the restarting (or intermediate operating mode) corresponding to the shifting of the logic core, from a first operating state, called sleep mode (inactive mode), to a second operating state, called active mode.

2. Description of Related Art

In sub-micronic technologies, consumed power depends on the dynamic power as well as the static power. This static power must be reduced during the long periods of inactivity of the logic core in order to ensure, for example, a longer service life of supply batteries.

A simple and efficient method for reducing this static power consists in associating one or more power switches to the logic core, as illustrated in FIG. 1, wherein one single power switch has been represented. The logic core LOG_CORE and the power switch INT are series-mounted between a first potential VDD and a second potential GND, the first potential VDD being, for example, a supply equal to 1.2 volts, and the second potential GND being, for example, a ground. The connection point between the Logic core LOG_CORE and the switch INT forms a virtual ground for the Logic core LOG_CORE. The virtual ground is carried to a third potential VGNDV. The switch INT may be an NMOS transistor (n-channel Metal Oxide Semiconductor), the source of which is connected to the second potential GND and the drain of which is connected to the logic core LOG_CORE.

Usually, in this prior art solution, the switch INT is biased on its gate by a constant biasing potential VPLOA, and in sleep mode, the supply of logic core LOG_CORE is cut-off via the power switch INT, inducing a voltage homogenization in the whole logic core LOG_CORE. To exit this sleep mode and enter the active mode, it is necessary to clear the logic core loads beforehand through the power switch.

Through this evacuation of loads, a very high current, which can lead to different problems such as electromigration and a more rapid deterioration of power supply lines, but also generation of rebounds on these power supply lines, can appear. Meanwhile, these different lines are provided for the supply of neighboring circuits and consequently, if rebounds become too large, functionality problems may arise. Thus, it is necessary to limit these rebounds by limiting the discharge currents of logic cores during the shifting from the sleep mode to the active mode.

Further, by considering the fact that the transistor dimensioning was carried out upstream in order to limit, in the second operating mode, the loss in speed to a relatively weak value, when the gate of the power switch is excited by the biasing potential, the power switch should provide a conduction current sufficient for supplying the logic core, while limiting the drain-source voltage to a few millivolts. Thus, the transistors used are very wide and can conduct very large currents if their drain-source voltage becomes high.

As for logic core discharge, it can generate much larger currents than its dynamic consumption since all capacitors must be charged/discharged at the same time, without forgetting the propagation of glitches due to a mispositioning of the internal nodes.

In order to limit the discharge currents, S. Henzler, al., "Sleep Transistor circuits for Fine-Grained Power Switch-off With Short Power-down Times", IEEE ISSCC, pp. 302-303, February 2005, teaches the dissociation of the gates of the different switches (or only a part) in order to activate them one after the other with a certain delay. This technique makes it possible to limit the charge/discharge currents by modulating the number of transistors used during the reactivation stage. This number should increase with time as the drain-source voltage at the terminals of the switches decreases. Hence, one should dissociate all gates of the switches, thus implying a more complex routing, a surface loss, and a more important overall gate capacity. Moreover, it is more difficult to precisely monitor the activation sequencing of the various switches, especially when there is a technological variation.

There is a need for a device and a method for power switch monitoring allowing to remedy to at least one of the aforementioned limitations.

SUMMARY OF THE INVENTION

In an embodiment, a device comprises: a feedback control module comprising at least one first base means, the first base means comprising at least one first and one second power inputs respectively connected to the first and second potentials, a first input connected to the third potential, and a first output, the base module being capable of carrying the first output to a set potential representative of the third potential variation, and a biasing module of the switch comprising at least one second base means, the second base means comprising at least third and fourth power inputs respectively connected to the first and second potentials, a second input connected to the first output, and a second output connected to the switch, and being capable of carrying the second output to the biasing potential in accordance with the set potential, said biasing potential varying linearly with the decrease of the third potential.

The biasing potential of the switch, thus takes into account the variation of the third potential, and, hence, makes it possible to maintain a constant current at the switch terminals. The biasing potential being adaptively and dynamically monitored in a direct fashion, the discharge current is maintained at a constant level and the current peaks are limited.

Moreover, in this solution, with the monitoring device coming into contact with the switches, it is not necessary to modify the switch(es).

The biasing potential can be constant, for example, at 0.6 volts.

The biasing potential can linearly rise between a minimum reference value and a maximum reference value when the value of the third potential decreases.

The minimum reference value is, for example, equal to half the first potential value.

The maximum reference is, for example, equal to the first potential value.

In a preferred embodiment, the feedback control module further comprises a first activation means capable of activating or deactivating the first base means according to a state signal representing an operating mode of the logic core, said logic core being capable of operating according to a first or a second operating mode.

In this embodiment, the feedback control circuit does not exhibit important leakages since the device can be deactivated when not in use.

Moreover, the various operating modes can also be taken into account starting from one single state signal.

The feedback control module can also include a first detection means mounted between the first and second potential, the first detection means comprising at least one first input receiving the state signal, a second input receiving a potential correlated to the variation of the third potential, the first detection means being capable of generating at a detection output, a potential which represents the shifting of the third potential value below a threshold value.

Preferably, the feedback control module further comprises: a discharge means capable of setting the set potential to zero when the third potential is equal to zero, said discharge means being mounted between the first output and the second power input, and being controlled by said potential representing the shifting of the third potential value below a threshold value.

Thus, it is possible to force the set potential to zero when the third potential is equal to zero.

Preferably, the first activation means comprises at least a first switch controlled by the state signal and series-mounted between the second potential and the second power input, and a second switch controlled by a signal representing the state signal and series-mounted between the first potential and the first power input.

In the preferred embodiment, the biasing module further comprises: a second activation means capable of activating or deactivating the biasing module according to the state signal; a second detection means mounted between the third power input and the second potential, said second detection means being capable of generating a second set potential when the biasing potential is equal to half the first potential; a first charge means controlled by the second set potential, and capable of increasing the biasing potential setting speed to the minimum reference value by the first base module; and a second charge means controlled by the third potential and capable of increasing the biasing potential setting speed to the maximum reference value, said second charge means being mounted between the third power input and the second output.

Thus, it is also possible to turn off the biasing module when not in use.

Furthermore, at the very first beginning of restarting, the biasing potential can for example reach a value close to 0.6V more rapidly, and the biasing potential value can be detected by means of two inverters. When the biasing potential reaches for example 0.6V, the first charge means can be turned off.

Likewise, at the end of restarting, thanks to the second charge means, it is also possible to rapidly set the biasing potential value to for example 1.2V when the logic core is sufficiently discharged.

Preferably, the monitoring device further comprises a load recovery module for recovering the loads coming from the logic core, said load recovery module being mounted between the third potential and the biasing potential and being activated or deactivated by the state signal.

In fact, it can be interesting to recycle the loads coming from the logic core in order to increase the biasing potential, thereby improving the system's energy balance.

Moreover, this load recovery module is independent from the logic core and the switch, and is monitored by a same and single state signal which is used for activating the feedback control module and the biasing module.

In another embodiment, a method of monitoring at least one power switch in a sub-micronic circuit, the switch being mounted in series with a logic core between a first and a second potential, the connection point between the switch and the logic core being carried to a third potential, comprises, according to an intermediate operating mode corresponding to the shifting of the logic core from a first operating mode to a second operating mode, at least one step of biasing the switch with a biasing potential, which value is: according to a first stage, constant and correlated to a maximum value of current passing through the switch, when the third potential value is equal to a maximum reference value, according to a second stage, linearly increasing between a minimum reference value and a maximum reference value when the third potential value decreases, and according to a third stage, equal to the first potential value when the third potential value is equal to the second potential value.

The minimum reference value is for example equal to half the first potential value.

The maximum reference value is for example equal to the first potential value.

The biasing potential value is equal to half the first potential value when the third potential value is equal to the maximum reference value.

It is also possible to provide, in accordance with the intermediate operating mode, steps of: activating at least a biasing module and a feedback control module with a state signal, generating, by the feedback control module, a set potential representative of the third potential variation in the first, second and third stages, and generating, by the biasing module, said biasing potential in accordance with the value of said set potential.

Preferably, the method further comprises a step of setting the set potential value to zero when the third potential value is lower than a threshold value.

Preferably, according to the first stage and as long as the biasing potential has not yet reached the minimum reference value, the method further comprises a step of activating a first charge means capable of increasing the biasing potential setting speed to the minimum reference value.

It is also possible to provide, in accordance with the third stage and as long as the biasing potential has not yet reached the maximum reference value, a step of activating a second charge means capable of increasing the biasing potential setting speed to the maximum reference value.

Advantageously, the method further comprises steps of: activating a load recovery module recovering the loads from the logic core with the state signal, authorizing the transfer of loads from said logic core towards the switch in the first stage, and blocking the transfer of the loads from said logic core towards the switch in the second or third stage.

In an embodiment, a circuit comprises: a logic core coupled to a first potential at a first node and having a virtual ground node; a power transistor switch coupled between the virtual ground node and a second potential, the power transistor switch having a control terminal; and a feedback control circuit generating a bias voltage applied to the control terminal of the power transistor switch in response to a voltage at the virtual ground node.

BRIEF DESCRIPTION OF THE DRAWINGS

These and other objects, characteristics and advantages will be displayed in further detail in the following description of two preferred embodiments, carried out in a non limitative fashion according to the accompanying drawings wherein:

FIG. 5*a* illustrates a block diagram of the feedback control module according to the second embodiment;

FIG. 6*a* illustrates a block diagram of the biasing module according to the second embodiment;

FIG. 7*a* illustrates a block diagram of the load recovery module according to the second embodiment;

DETAILED DESCRIPTION OF THE DRAWINGS

Generally, the monitoring device is associated to a power switch INT. The power switch INT being series-mounted with a logic core LOG_CORE between first and second potentials VDD and GND. The first potential being, for example, a power potential equal to 1.2 volts, and the second potential is, for example, a ground potential for example equal to 0 volts. The connection point between the switch and the logic core, called the virtual ground, is carried to a third potential VGNDV, also called virtual ground potential. The switch is biased by a biasing potential VOUT generated by the monitoring device. The power switch can be an NMOS-type transistor of which the drain forms a virtual ground, the source being connected to the second potential GND, and the gate is biased by the biasing potential VOUT.

In the first operating mode SLEEP, the logic core is charged to the first potential VDD. Before the circuit is considered to be operational, i.e., in the second operating mode ACTIVE, the logic core is placed in the intermediate operating mode, i.e., on restarting, corresponding to the shifting of the logic core from the first operating mode to the second operating mode, and wherein various capacitors of the logic core are discharged and various internal nodes of the logic core are positioned. In order to carry out this discharge, the power switch INT is placed into a conductive state. During the discharge of the logic core, the third potential progressively decreases from the first potential value VDD to the second potential value GND. Thus, the drain-source voltage of the power switch also drops from the first potential value VDD to the second potential value GND.

In order to limit the discharge current peaks, the monitoring device according to the invention biases the switch on its gate with a biasing potential VOUT the value of which is equal, for example, to 0.6 volts, then by increasing the biasing potential value by the drop in drain-source voltage, the discharge current is maintained at a constant value.

During the intermediate operating mode, all internal nodes of the logic core get progressively discharged by maintaining their voltage at half the sum of first potential value VDD and third potential value, i.e., at (VDD+VGNDV)/2. The internal nodes of logic core then reach sufficiently high voltages so that drained currents become equally large. The third potential thus, remains more or less constant for enabling a rapid evacuation of the loads through the switch. Finally, with all internal nodes having reached equilibrium values, it remains only to discharge the virtual ground. This discharge stage becomes gradually slower as the drain-source voltage of the switch also decreases.

Thus, the monitoring device of the power switch should feedback control the biasing potential of the switch by the third potential VGNDV in order to maintain the discharging speed while limiting the current peaks.

Figure 1:
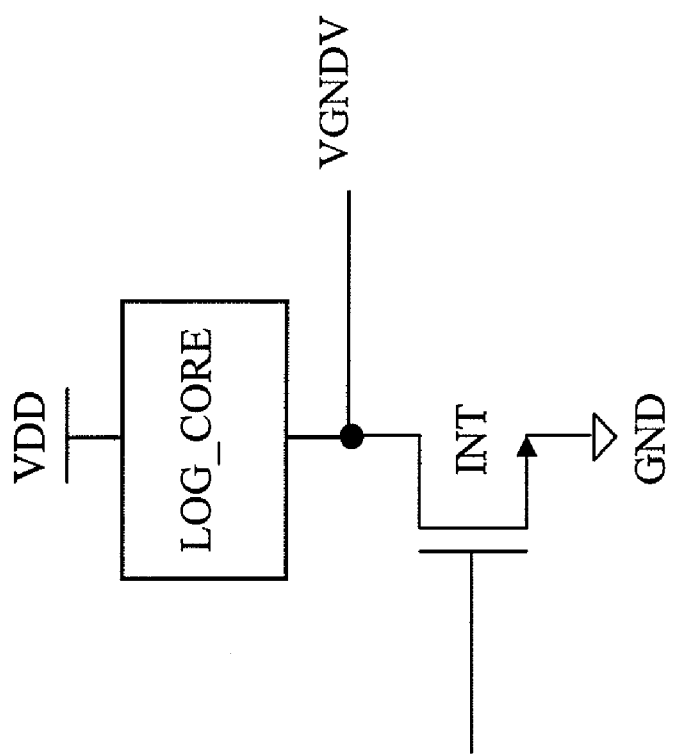
FIG. 1, previously described, exhibits a power switch associated with a logic core.
Figure 2:
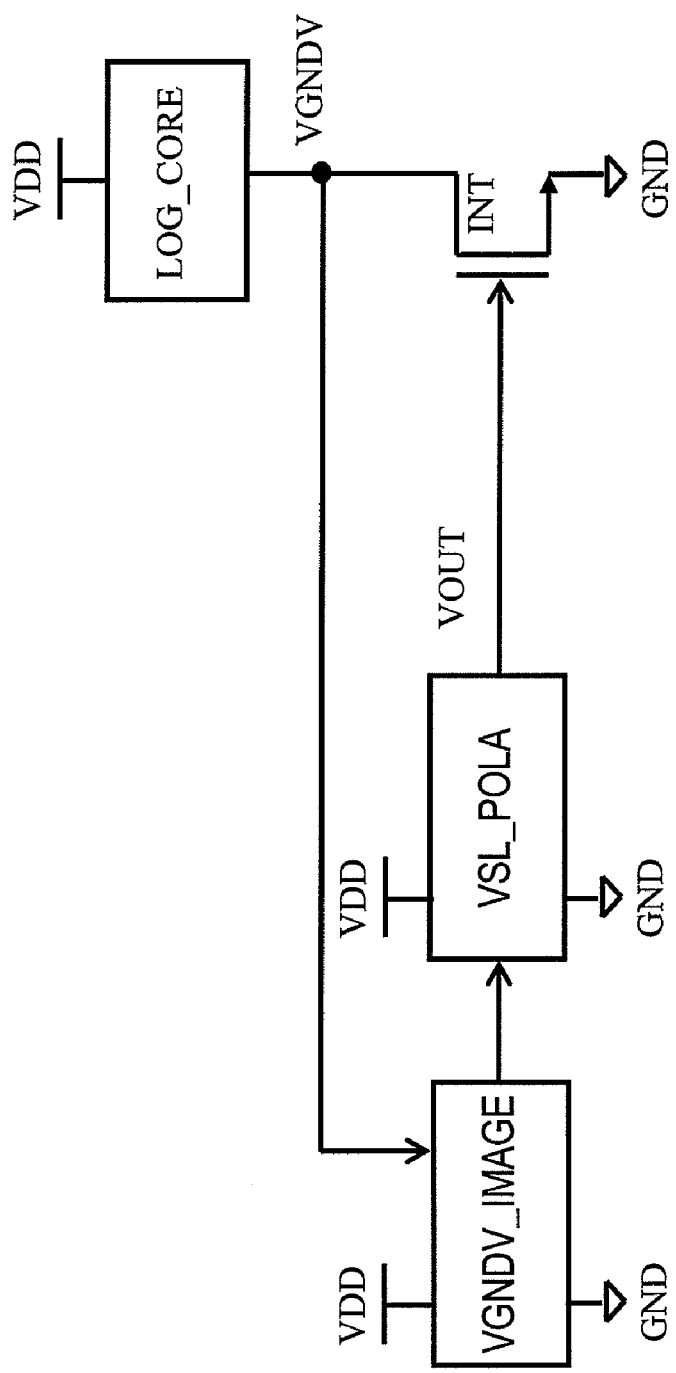
FIG. 2 illustrates a block diagram of a monitoring device according to a first embodiment.
Figure 3:
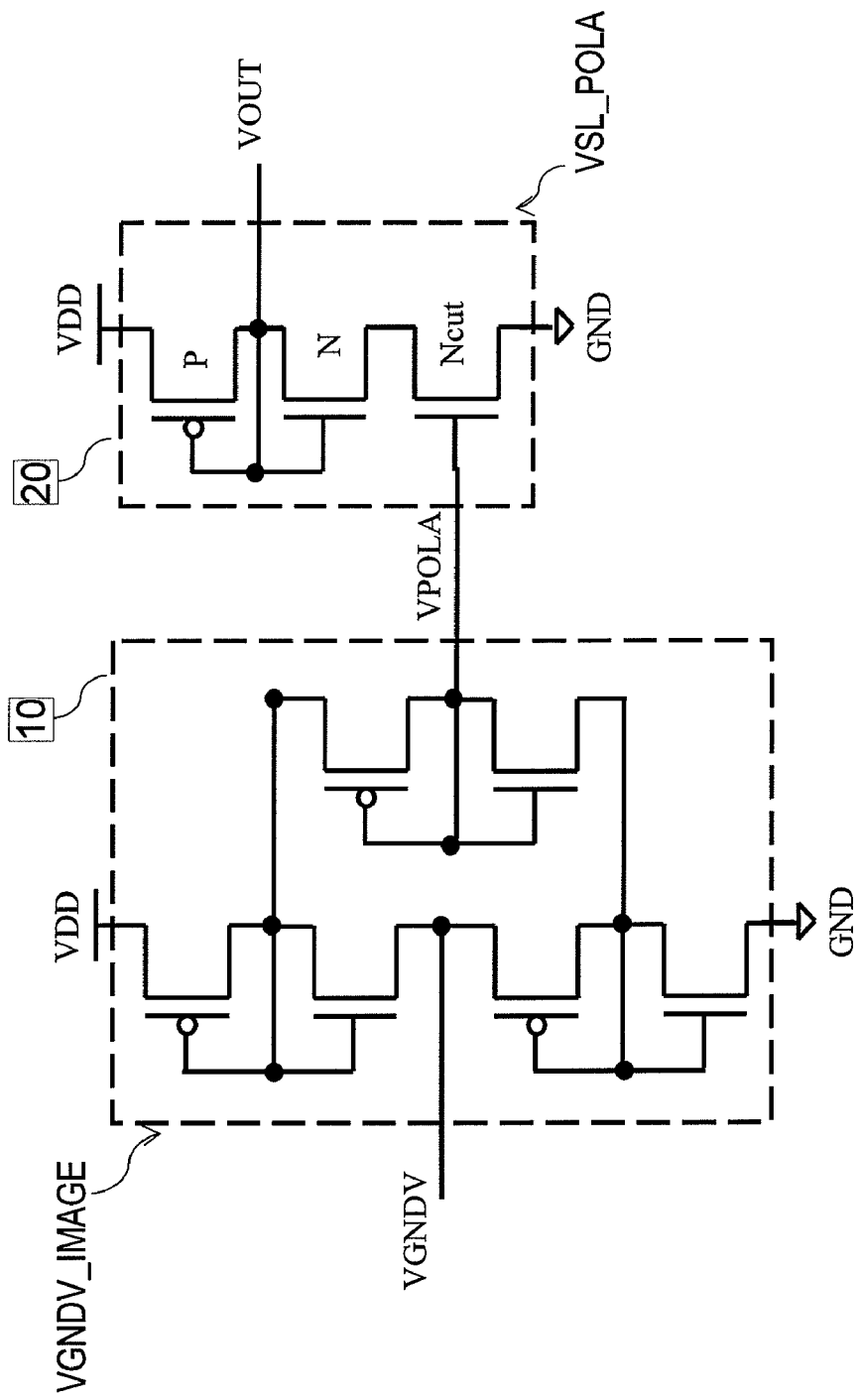
FIG. 3 illustrates in a more detailed fashion the monitoring device according to the first embodiment.
Figure 4:
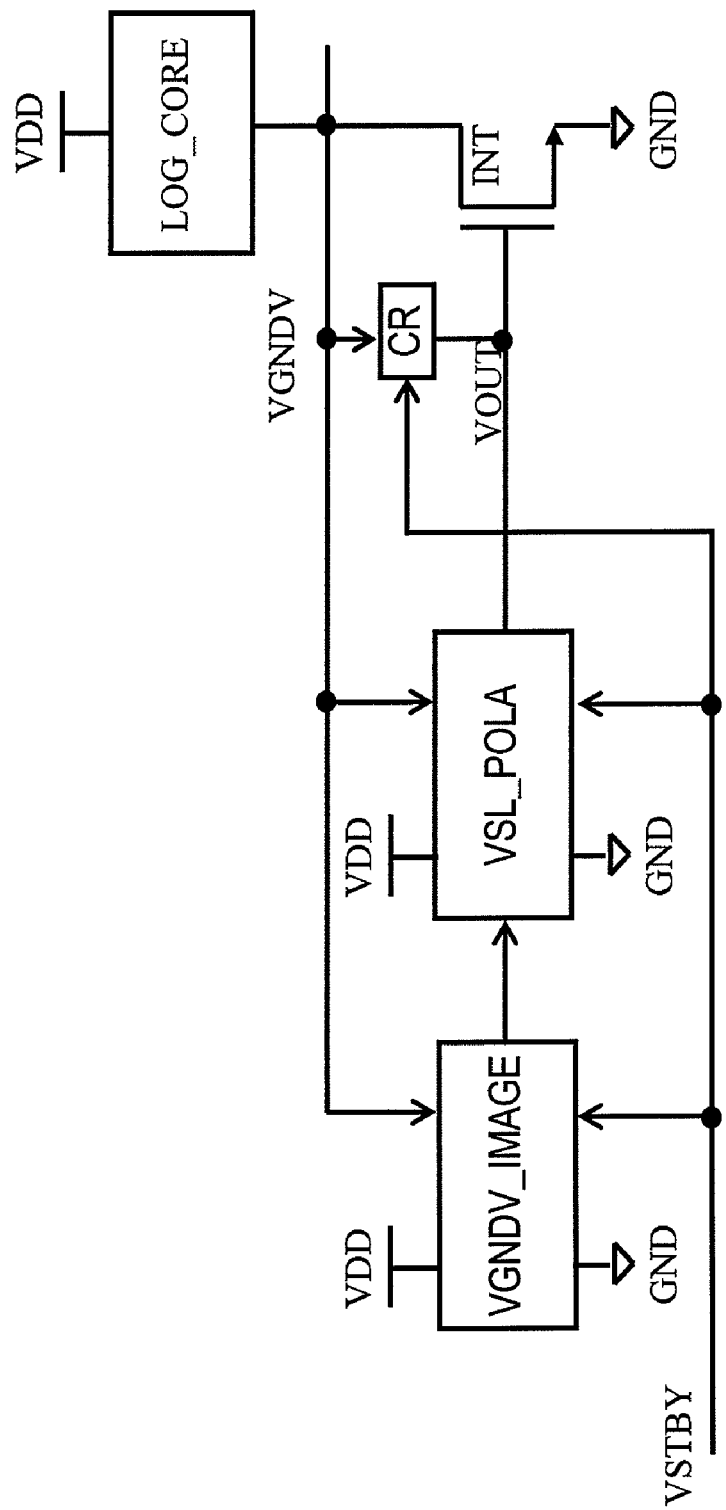
FIG. 4 illustrates a block diagram of a monitoring device according to a second embodiment.
Figure 5B:
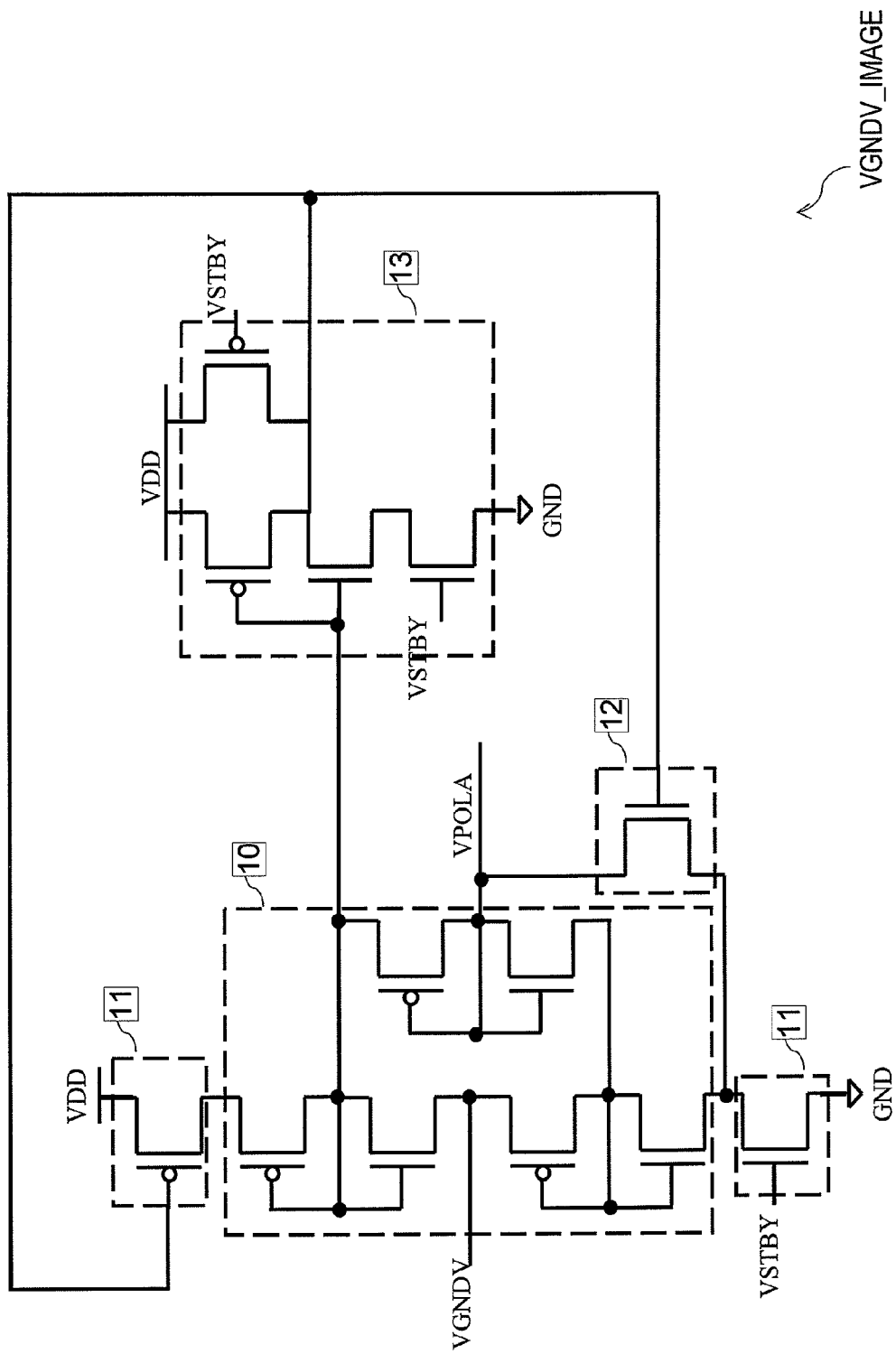
FIG. 5*b* illustrates in a more detailed fashion, the feedback control module according to the second embodiment.
Figure 6B:
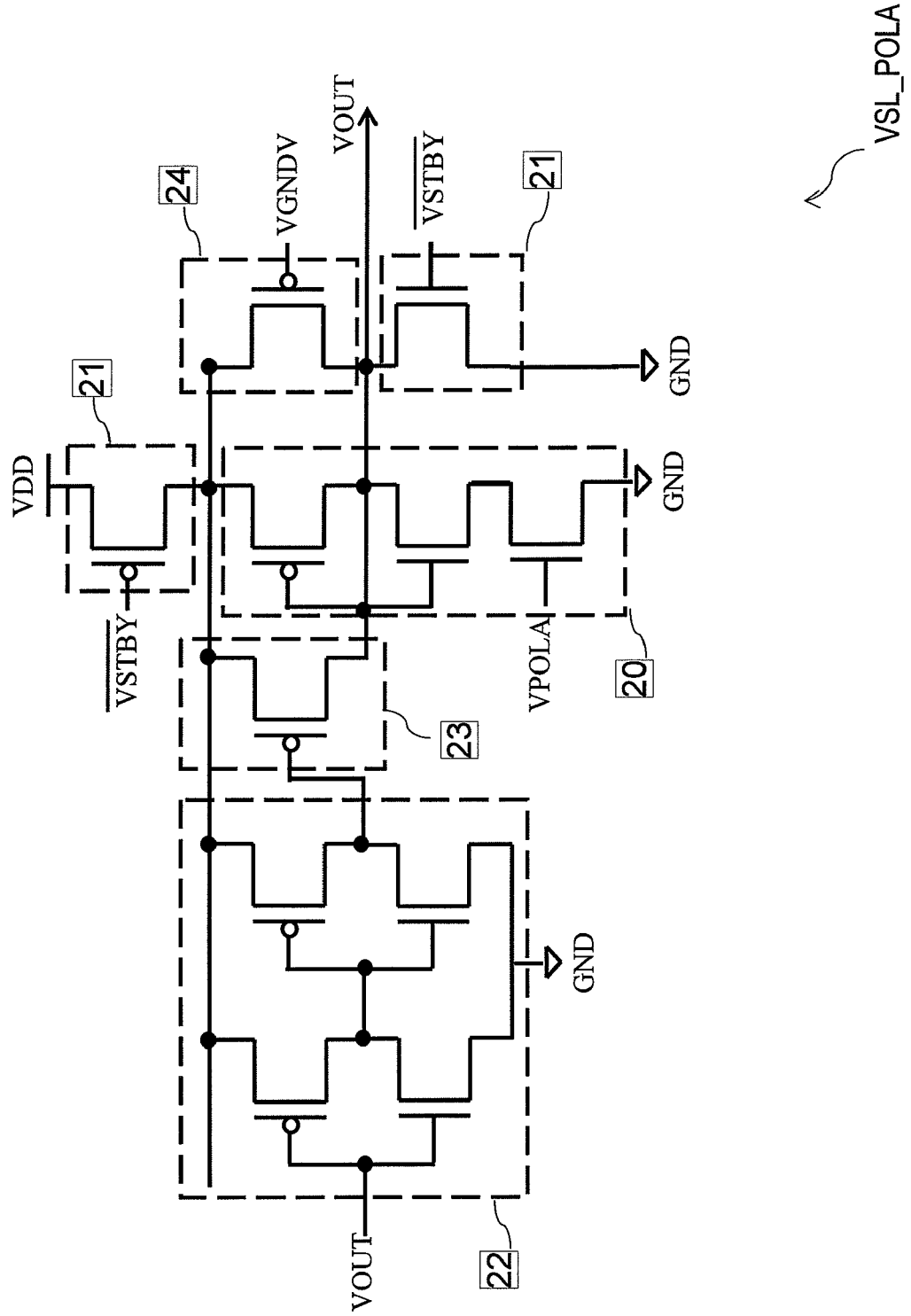
FIG. 6*b* illustrates in a more detailed fashion the biasing module according to the second embodiment.
Figure 7B:
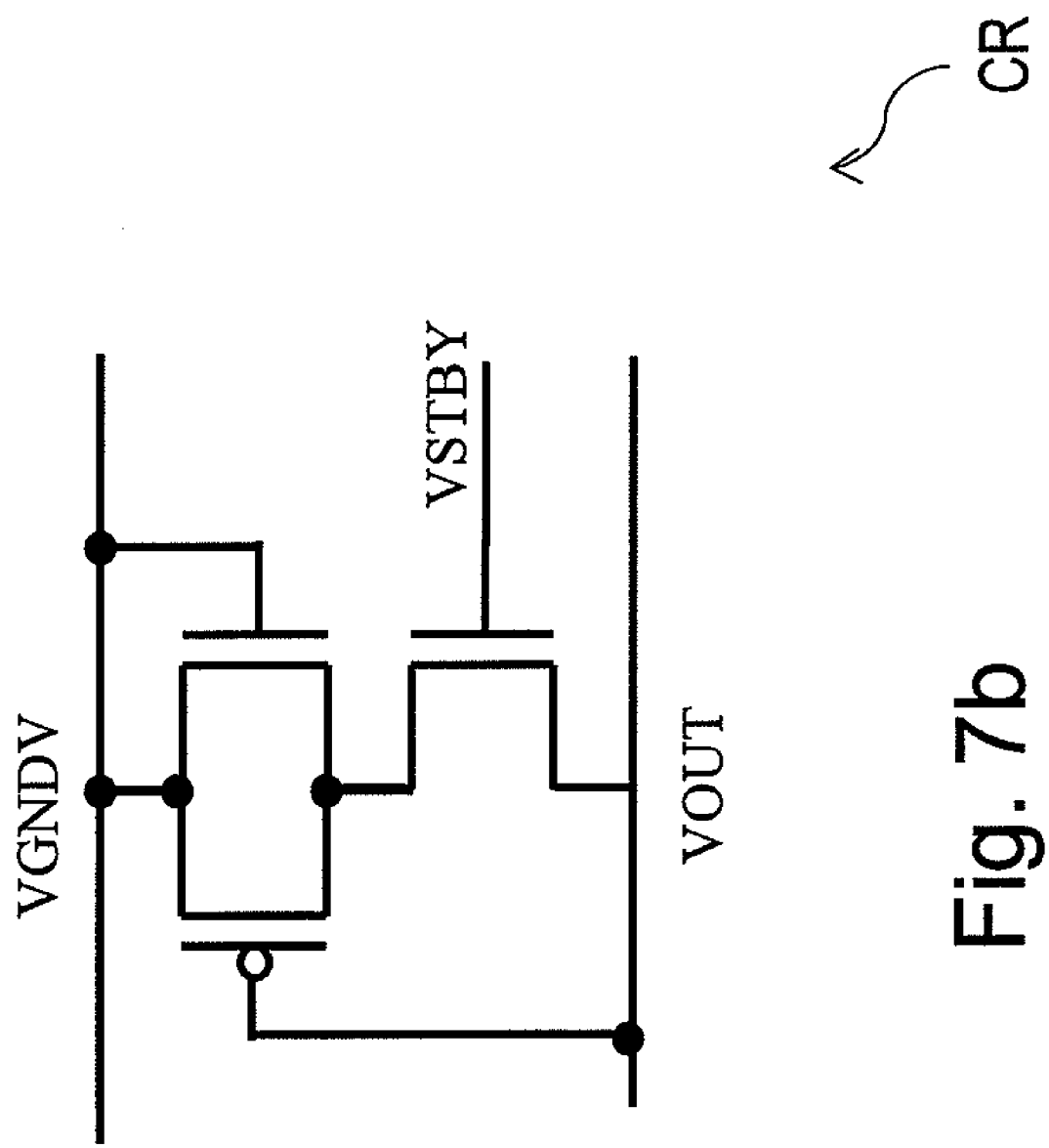
FIG. 7*b* illustrates in a more detailed fashion the load recovery module according to the second embodiment.

As illustrated in FIGS. 2 and 3, the monitoring device according to a first embodiment, comprises a feedback control module VGNDV_IMAGE of the third potential VGNDV comprising at least one first base means 10. The first base means 10 is mounted between the first and second potentials VDD, GND, receives third potential VGNDV, and generates a set potential VPOLA representative of the variation of the third potential VGNDV. In accordance with the intermediate operating mode corresponding to the shifting of the logic core from a first operating mode SLEEP to a second operating mode ACTIVE, the third potential value VGNDV is:

according to a first stage, equal to a maximum reference value, for example 1.2 volts, according to a second stage, decreasing, and according to a third sage, equal to the value of the second potential GND, for example zero volts.

As illustrated in FIGS. 2 and 3, the monitoring device according to the first embodiment, further comprises a biasing module VSL_POLA of the switch INT comprising at least one second base means 20 mounted between first and second potentials VDD and GND. The second base means 20 receiving the set potential VPOLA and being capable of making the biasing potential VOUT vary according to the set potential VPOLA, said set potential VPOLA varying linearly along with the decrease of third potential VGNDV.

Figure 8:
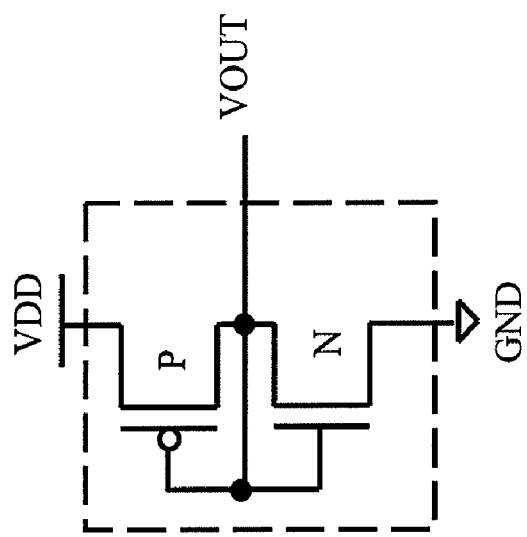
FIG. 8 illustrates an elementary circuit used in the monitoring device.

For example, the second base means 20 is formed of an elementary circuit as illustrated in FIG. 8, and a transistor noted Ncut. The elementary circuit is comprised of a PMOS-type transistor noted P, and of a NMOS-type transistor, noted N, series-mounted between the first and second potentials and of which gates are connected with each other and also connected to the connection point between the NMOS-type transistor and the PMOS-type transistor, and depicted with reference VOUT in FIG. 8. This elementary circuit makes it possible to select a potential value about half the first potential value, more or less 0.1 volts, by modifying the ratio of the P transistor width Wp to the N transistor width Wn. Ratio Wp/Wn can be set to 1.

The biasing of transistor Ncut serialized with the elementary circuit gradually increases the biasing potential VOUT when third potential VGNDV decreases, thus, enabling to obtain a linear behavior of first base means 10. The transistor Ncut is for example biased at 0.6 volts, and ratio Wncut/Wn is for example set to 3, Wncut being the width of transistor Ncut.

The first base means 10 is, for example, composed of three elementary circuits mounted according to FIG. 3. By setting for example the first potential VDD to 1.2 volts, second potential GND to 0 volts, and by keeping the ratio values as defined above, the set potential VPOLA allows for the monitoring of the transistor Ncut conduction.

Thus, in the intermediate operating mode, the monitoring device biases the power switch with the biasing potential VOUT, the value of which is:

- according to a first stage, increased by zero volts at a determined value (for example, 0.6 volts) which corresponds to the value of current passing through switch INT allowed during discharging, when the value of third potential VGNDV is equal to a maximum reference value,
- according to a second stage, linearly increasing between the determined value (or minimum reference value) and a maximum reference value (for example, 1.2 volts), when the value of the third potential VGNDV decreases, and
- according to a third stage, equal to the value of the first potential VDD when the value of third potential VGNDV is equal to the value of the second potential GND.

Thus, the biasing potential VOUT is made linearly varying with the decrease of third potential VGNDV.

Hereinafter, with reference to FIGS. 4 to 7b, a monitoring device according to a second embodiment is described.

The monitoring device according to the second embodiment comprises the feedback control module VGNDV_IMAGE, biasing module VSL_POLA and a load recovery module recovering the loads from logic core CR.

In this second embodiment, the feedback control module comprises the first base means 10, a first activation means 11, a first detection means 13 and a discharge means 12. The first base means 10 comprises at least first and second power inputs, respectively connected to the first and second potentials VDD and GND, a first input connected to the third potential VGNDV, and a first output, base module 10 being capable to carry the first output to a set potential VPOLA representative of the third potential VGNDV variation.

For example, the first activation means 11 is formed of a first switch controlled by a state signal VSTBY and series-mounted between the second potential GND and the second power input and a second switch controlled by a signal representative of the state signal VSTBY and series-mounted between the first potential VDD and the first power input, state signal VSTBY is, for example, a logic signal.

The first activation means 11 makes it possible to activate or deactivate the first base means 10 in accordance with the state signal VSTBY representative of an operating mode of logic core. For example, the logic core is in the first operating mode when the state signal is at 0, and the logic core is in the second operating mode when the state signal is at 1.

The first detection means 13 is mounted between the first and second potentials VDD and GND, and comprises at least a first input receiving the state signal VSTBY so as to activate or deactivate the first detection means 13, a second input receiving a potential correlated to the third potential VGNDV variation. The first detection means 13 makes it possible to generate at a detection output a potential representative of the shifting of the value of third potential VGNDV below a threshold value.

The discharge means 12 for setting the set potential VPOLA to zero when third potential VGNDV is close to zero.

Discharge means 12 is mounted between the first output and second power input, and is controlled by the potential representative of the shifting of the value of third potential VGNDV below a threshold value.

Thus, when the state signal VSTBY is equal to 0 (first operating mode), the first switch of first activation means 11 is put out of conduction and the potential carried to the detection output is equal to the value of first potential VDD, which puts the second switch of first activation means 11 out of conduction. When state signal VSTBY passes to 1 (second operating mode), the first and second switches of first activation means 11 become conductive, and the first base module generates set potential VPOLA. When the value of third potential VGNDV becomes close to the value of second potential GND (for example, 0 volts), the potential present at the detection output puts second switch of first activation means 11 out of conduction, the set potential VPOLA then completely discharges via discharge means 12.

Biasing module VSL_POLA comprises the second base means 20, a second activation means 21, a second detection means 22, a first charge means 23 and a second charge means 24.

Second base means 20 comprises at least third and fourth power inputs respectively connected to first and second potentials VDD and GND, a second input connected to the first output, and a second output connected to power switch INT. Second base means 20 is capable of carrying the second output to biasing potential VOUT in accordance with set potential VPOLA, said biasing potential VOUT linearly varying with the decrease of third potential VGNDV.

Second activation means 21 enables to activate or deactivate biasing module VSL_POLA according to the state signal VSTBY.

Second detection means 22 is mounted between third power input and second potential GND. Second detection means 22 enables to generate a second set potential when biasing potential VOUT is equal to half of first potential VDD.

First charge means 23 is controlled by the second set potential, and enables to increase the biasing potential VOUT setting speed to the minimum reference value (for example, 0.6 volts) by the second base module 20.

Second charge means 24 is controlled by third potential VGNDV and enables to increase the biasing potential VOUT setting speed to the maximum reference value (for example, 1.2 volts). Second charge means 24 is mounted between the third power input and the second output.

Thus, when the state signal is at 0, the biasing module is deactivated and the value of biasing potential VOUT is set to zero. When the state signal is at 1, the biasing module is activated. First charge means is also activated so that the value of biasing potential VOUT rapidly reaches the minimum reference value (for example, 0.6 volts). When the second detection means detects that biasing potential VOUT has reached this minimum reference value, the first charge means is deactivated. The second base means 20 then adapts the biasing potential VOUT based on the third potential VGNDV by means of set potential VPOLA. When the logic core is sufficiently discharged, the third potential becomes lower and lower until making the second charge means 24 conductive, thus accelerating on the one hand the biasing potential VOUT setting speed to a maximum reference value (for example, 1.2 volts), and on the other hand the discharge of the logic core.

The second detection means 22 can for example be formed by two inverters mounted in series.

The load recovery module CR recovering the loads from logic core is mounted between third potential VGNDV and biasing potential VOUT, and is activated or deactivated by the state signal VSTBY.

The load recovery module CR enables to recycle the loads from the logic core in order to increase the biasing potential value VOUT, thereby improving the energy balance of the system formed by the logic core, the power switch and the monitoring device.

Thus, when the state signal VSTBY is at 0, the load recovery module CR is deactivated, thus isolating logic core from the second output of the biasing module VSL_POLA. When the state signal VSTBY passes to 1, the load recovery module CR is activated and transfers the loads coming from the logic core towards the second output of the biasing module. When third potential VGNDV and biasing potential VOUT become similar, the difference of potential at terminals of load recovery module CR becomes almost zero, thus, ending the recycling of loads. When biasing potential VOUT is higher than third potential VGNDV, the load recovery module is blocked.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A device for controlling at least one power transistor that is series-mounted with a logic core between a first potential and a second potential, wherein a connection point between the power transistor and the logic core presents a third potential, the power transistor being biased by a biasing potential, comprising:
    a feedback control module having a first base circuit with first and second power inputs and a first input connected to receive the third potential, and generating a first output at a potential representative of a variation of the received third potential; and
    a biasing module having a second base circuit with third and fourth power inputs and a second input connected to receive the first output from the feedback control module, and generating a second output as the biasing potential in response to the potential representative of the variation of the received third potential, said biasing potential linearly varying with a decrease of the third potential.

2. The device according to claim 1, wherein the biasing potential is linearly increasing between a minimum reference value and a maximum reference value when the value of the third potential decreases.

3. The device according to claim 2, wherein the minimum reference value is half the value of the first potential.

4. The device according to claim 3, wherein the maximum reference value is equal to the value of the first potential.

5. The device according to claim 1, wherein the feedback control module further comprises a first activation circuit for controlling activation of the first base circuit responsive to a received state signal representative of an operating mode of the logic core, said logic core being capable of operating according to a first or a second operating mode.

6. The device according to claim 5, wherein the feedback control module further comprises a first detection circuit comprising at least a first input receiving the state signal and a second input receiving from the first base circuit a potential correlated to the variation in the third potential, the first detection circuit generating at a detection output a potential representative of a shifting of the third potential value below a threshold value.

7. The device according to claim 6, wherein the feedback control module further comprises a discharge circuit for setting the potential to zero when the third potential is equal to zero, said discharge circuit being mounted between the first output and the second power input, and being controlled by said potential representative of the shifting of the value of third potential below the threshold value.

8. The device according to claim 5, wherein the first activation circuit comprises:
    a first transistor controlled by the state signal and series-mounted between the second potential and the second power input, and
    a second transistor controlled by a signal representative of the state signal and series-mounted between the first potential and the first power input.

9. The device according to claim 6, wherein the biasing module further comprises:
    a second activation circuit for activating or deactivating the biasing module in accordance with the state signal,
    a second detection circuit mounted between the third power input and the second potential, said second detection circuit generating a set potential when the biasing potential is equal to half the first potential,
    a first charge circuit controlled by the set potential and which increases a biasing potential setting speed to a minimum reference value by the second base circuit, and
    a second charge circuit controlled by the third potential which increases the biasing potential setting speed to a maximum reference value, said second charge circuit being mounted between the third power input and the second output.

10. The device according to claim 5, further comprising a load recovery module for recovering loads from the logic core, said load recovery module being mounted between the third potential and the biasing potential, and being activated or deactivated by the state signal.

11. A method of controlling at least one power transistor that is series-mounted with a logic core between a first potential and a second potential, a connection point between the transistor and the logic core presenting a third potential, the method comprising, when in an intermediate operating mode corresponding to a shifting of the logic core from a first operating mode to a second operating mode:
    biasing the transistor with a biasing potential the value of which is:
        according to a first stage, constant and correlated to a maximum value of current passing through the transistor, when the value of the third potential is equal to a maximum reference value,
        according to a second stage, linearly increasing between a minimum reference value and the maximum reference value when the value of the third potential decreases, and
        according to a third stage, equal to the value of the first potential when the value of the third potential is equal to the value of the second potential.

12. The method according to claim 11, wherein the minimum reference value is equal to half the value of the first potential.

13. The method according to claim 12, wherein the maximum reference value is equal to the value of the first potential.

14. The method according to claim 11, wherein the biasing potential value is equal to half the value of the first potential when the value of the third potential is equal to the maximum reference value.

15. The method according to claim 11, further comprising, according to the intermediate operating mode:
- activating at least a biasing module and a feedback control module with a state signal,
- generating, through the feedback control module, a set potential representative of the third potential variation in the first, second and third stages, and
- generating, through the biasing module, said biasing potential in accordance with the value of said set potential.

16. The method according to claim 15, further comprising setting the set potential value to zero when the value of the third potential is lower than a threshold value.

17. The method according to claim 16, wherein, according to the first stage and as long as the biasing potential has not yet reached the minimum reference value, further comprising: activating a first charge circuit to increase a biasing potential setting speed to the minimum reference value.

18. The method according to claim 17, wherein, according to the third stage and as long as the biasing potential has not yet reached the maximum reference value, further comprising: activating a second charge circuit to increase the biasing potential setting speed to the maximum reference value.

19. The method according to claim 11, further comprising:
- activating a load recovery module for recovering loads from the logic core in response to a state signal,
- authorizing transfer of the loads from said logic core towards the transistor in the first stage, and
- blocking transfer of the loads from said logic core towards the transistor in the second or third stage.

* * * * *